(12) United States Patent
Mathew et al.

(10) Patent No.: US 7,018,876 B2
(45) Date of Patent: Mar. 28, 2006

(54) TRANSISTOR WITH VERTICAL DIELECTRIC STRUCTURE

(75) Inventors: Leo Mathew, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/871,772

(22) Filed: Jun. 18, 2004

(65) Prior Publication Data

US 2005/0282345 A1 Dec. 22, 2005

(51) Int. Cl.
*H01L 21/00* (2006.01)
*H01L 21/84* (2006.01)
*H01L 21/8238* (2006.01)
*H01L 21/336* (2006.01)

(52) U.S. Cl. ............... 438/151; 438/212; 438/283
(58) Field of Classification Search ........... 438/197, 438/217, 311, 149, 187, 286, 151, 212, 283, 438/257; 257/331, 365
See application file for complete search history.

(56) References Cited

U.S. PATENT DOCUMENTS

| | | | |
|---|---|---|---|
| 4,648,173 A * | 3/1987 | Malaviya | ............... 438/151 |
| 4,859,623 A | 8/1989 | Busta | |
| 5,689,127 A | 11/1997 | Chu et al. | |
| 5,804,848 A | 9/1998 | Mukai | |
| 6,011,725 A | 1/2000 | Eitan | |
| 6,097,065 A | 8/2000 | Forbes et al. | |
| 6,150,687 A | 11/2000 | Noble et al. | |
| 6,300,182 B1 | 10/2001 | Yu | |
| 6,330,184 B1 | 12/2001 | White et al. | |
| 6,355,961 B1 | 3/2002 | Forbes | |
| 6,372,559 B1 | 4/2002 | Crowder et al. | |
| 6,396,108 B1 | 5/2002 | Krivokapic et al. | |
| 6,413,802 B1 | 7/2002 | Hu et al. | |
| 6,414,356 B1 | 7/2002 | Forbes et al. | |
| 6,433,609 B1 | 8/2002 | Voldman | |
| 6,458,662 B1 | 10/2002 | Yu | |
| 6,472,258 B1 | 10/2002 | Adkisson et al. | |

(Continued)

FOREIGN PATENT DOCUMENTS

DE    101 25 967 C1    5/2001

(Continued)

OTHER PUBLICATIONS

Related U.S. Appl. No. 10/074,732 entitled "Method of Forming a Vertical Double Gate Semiconductor Device and Structure Thereof" filed Sep. 3, 2002.

(Continued)

*Primary Examiner*—Walter L. Lindsay, Jr.
(74) *Attorney, Agent, or Firm*—David G. Dolezal; Robert L. King

(57) ABSTRACT

A transistor (103) with a vertical structure (113) that includes a dielectric structure (201) below a semiconductor structure (109). The semiconductor structure includes a channel region (731) and source/drain regions (707, 709). The transistor includes a gate structure (705, 703) that has a portion laterally adjacent to the semiconductor structure and a portion laterally adjacent to the dielectric structure. In one embodiment, the gate structure is a floating gate structure wherein a control gate structure (719) also includes portion laterally adjacent to the dielectric structure and a portion laterally adjacent to the semiconductor structure. In some examples, having a portion of the floating gate and a portion of the control gate adjacent to the dielectric structure acts to increase the control gate to floating gate capacitance without significantly increasing the capacitance of the floating gate to channel region.

33 Claims, 4 Drawing Sheets

U.S. PATENT DOCUMENTS

| | | | |
|---|---|---|---|
| 6,583,469 B1 | 6/2003 | Fried et al. | |
| 6,657,252 B1* | 12/2003 | Fried et al. | 257/316 |
| 6,855,588 B1* | 2/2005 | Liao et al. | 438/197 |
| 2003/0113970 A1 | 6/2003 | Fried et al. | |
| 2003/0178670 A1 | 9/2003 | Fried et al. | |

FOREIGN PATENT DOCUMENTS

| | | |
|---|---|---|
| WO | WO 00/021118 | 4/2000 |

OTHER PUBLICATIONS

Related U.S. Appl. No. 10/443,375 entitled "Transistor With Independent Gate Structures" filed May 22, 2003.

Related U.S. Appl. No. 10/443,908 entitled "Memory with Charge Storage Locations" filed May 22, 2003.

Related U.S. Appl. No. 10/427,141 entitled "Semiconductor Fabrication Process with Asymmetrical Conductive Spacers" filed Apr. 30, 2003.

Related U.S. Appl. No. 10/324,787 entitled "Vertical MOSFET with Asymmetric Gate Structure," filed Dec. 20, 2002.

Lee et al.; "Multilevel Vertical-Channel SONOS Nonvolatile Memory on SOI"; IEEE Electron Device Letters, 2002; pp 1-3 and 208-209.

Yu, Bin et al; FinFET Scaling to 10nm Gate Length:; IEEE IDEM 2002; pp 251-254; IEEE.

Choi, Yang-Kyu et al.; "Sub-20nm CMOS FinFET Technologies"; 2001 IEEE, 4 pp.

Kedzierski, Jakub et al.; "High-Performance Symmetric-Gate and CMOS-Compatible Vt Asymmetric-Gate FinFET Devices"; 2001; IEEE; 4 pp.

Kim, Keunwoo et al.; "Double-Gate CMOS Symmetrical—Versus Asymmetrical-Gate Devices"; IEEE Transactions On Electron Devices, vol. 48, No. 2; Feb. 2001; pp 294-299.

Fossum, Jerry G. et al.; "Extraordinarily High Drive Currents in Asymmetrical Double-Gate MOSFETS"; Superlattices and Microstructures, vol. 28, No. 5/6, 2000, 2000 Academic Press, pp 525-530.

Hisamoto, Digh et al.; "FinFET—A Self-Aligned Double-Gate MOSFET Scalable to 20 nm"; IEEE Transactions on Electron Devices; vol. 47, No. 12, Dec. 2000, pp 2320-2325.

Tanaka, Tetsu et al; Ultrafast Operation of $V_{th}$-Adjusted$^{p+n+}$ Double Gate SOI MOSFET's; IEEE Electron Device Letters, vol. 15, No. 10, Oct. 1994; pp. 386-388.

Chan et al.; "A True Single-Transistor Oxide-Nitride-Oxide EEPROM Device"; IEEE Electron Device Letters; Mar. 1987; pp 93-95; vol. EDL-8, No. 3.

Gonzalez, Fernando Sr. et al.; "A Dynamic Source-Drain Extension (DSDE) MOSFET Using a Separately Biased Conductive Spacer"; pp 645-648.

Singer, Peter, "Duel Gate Control Provides Treashold Voltage Options," Semiconductor International, Nov. 1, 2003, 2 pgs.

* cited by examiner

TRANSISTOR WITH VERTICAL DIELECTRIC STRUCTURE

BACKGROUND OF THE INVENTION

1. Field of the Invention

This invention relates in general to semiconductor devices and in particular to transistors with vertical structures.

2. Description of the Related Art

Some memories such as e.g. flash memories or other types of non volatile RAM utilize a floating gate structure of a transistor for storing charge indicative of a value being stored in a memory cell being implemented with the transistor. The ratio of the capacitance between a control gate and a floating gate of a transistor to the capacitance between the floating gate and a channel region of the transistor affects the ability to read and write to a memory cell implemented with the transistor. Typically, it is desirable to have a larger capacitance between the control gate and the floating gate than between the floating gate and the channel region.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

The following sets forth a detailed description of a mode for carrying out the invention. The description is intended to be illustrative of the invention and should not be taken to be limiting.

FIGS. 1–8 show views of various stages of one embodiment in the manufacture of a transistor with a dielectric vertical structure according to the present invention.

Figure 1:
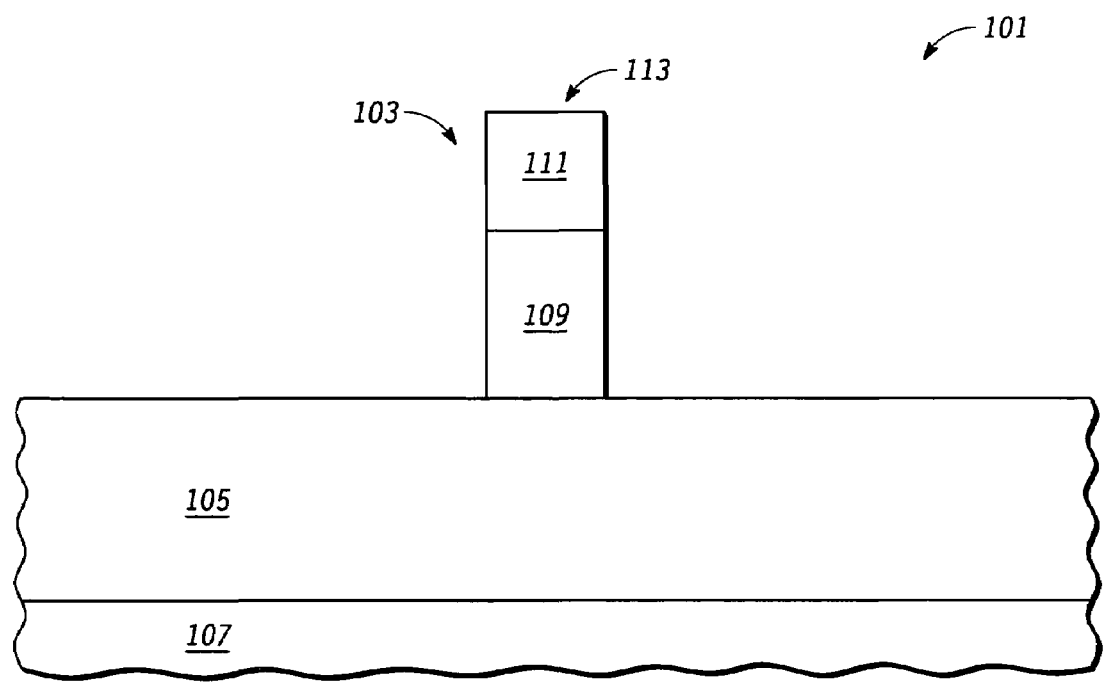
FIG. 1 is a partial cross-sectional view of one embodiment a wafer during a stage in its manufacture according to the present invention.

FIG. 1 shows partial cross-sectional view of a wafer 101 on which a transistor 103 will be formed. In the embodiment shown, wafer 101 has a semiconductor on insulator (SOI) configuration with an insulator layer 105 (e.g. silicon oxide) located over a substrate 107 of e.g. bulk silicon. In other embodiments, wafer 101 may have other configurations including other SOI configurations such as e.g. silicon on sapphire or silicon on glass.

A vertical structure 113 of semiconductor structure 109 and dielectric structure 111 is formed from a layer of silicon (or other semiconductor material in other embodiments e.g. silicon germanium or germanium located on layer 105 and a dielectric layer (e.g. nitride, oxide) located on the layer of silicon. The layer of silicon and dielectric layer are patterned to form vertical structure 113 by conventional photolithography techniques or by spacer definition. In some embodiments, vertical structure 113 is referred to as a fin structure. In some embodiments, the layer of semiconductor material used to form structure 109 may be doped prior to forming structure 109. In other embodiments, structure 109 may be doped after patterning.

Figure 2:
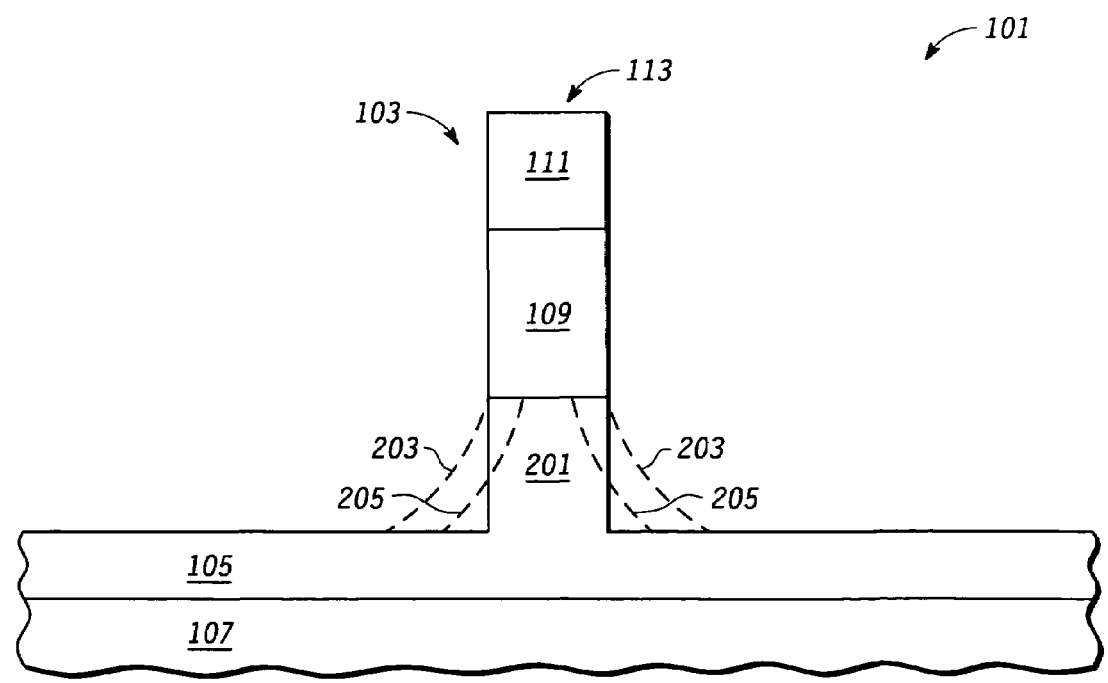
FIG. 2 is a partial cross-sectional view of one embodiment a wafer during another stage in its manufacture according to the present invention.

FIG. 2 shows a partial side view of wafer 101 after a dielectric structure 201 is formed by the removal of material of layer 105. In one embodiment, material from a top portion of layer 105 outside of vertical structure 113 is removed by dry etching to form dielectric structure 201 by reducing the thickness of layer 105 outside of vertical structure 113. The desired height of structure 201 is dependent upon the amount of thickness removed from layer 105. In other embodiments, other processes for forming structure 201 may be utilized to remove material of layer 105 including using a wet etch of layer 105. With some embodiments of a wet etch, a portion of dielectric structure 111 may be removed beneath structure 109 (e.g. an undercut). See for example, structure profile 205 shown in dashed lines in FIG. 2. With other embodiments, other types of etching processes may be utilized. Also, in some embodiments, some of these processes may provide the structure profile 203 shown in dash lines in FIG. 2. In these embodiments, structures 109 and 111 are utilized as masks during the etching to form structure 201.

In one embodiment, layer 105 is etched (e.g. with a dry etch and/or wet etch) for a predetermined time to reduce the thickness of layer 105 at selective locations to a desired level. In some embodiments, layer 105 may include other types of dielectric materials and/or may include layers of different materials where an etchant is used that is selective with respect to the different layers.

In some embodiments, structure 201 has about the same vertical height as structure 109. In other embodiments, structure 201 may have a greater or lesser height than structure 109. In some embodiments, structure 201 is up to ten times higher than structure 109. In some embodiments, the differences in heights between structure 109 and structure 201 depends upon the desired ratio between the capacitance of the control gate and the floating gate to the capacitance between the floating gate and a channel region located in structure 109. Also in other embodiments, the differences in heights may also depend upon the desired drive current of transistor 103. In some embodiments, the height of structure 201 may be in the range of 5–200 nm and the height of structure 109 may be in the range of 2–200 nm. These structures may have other heights in other embodiments.

Figure 3:
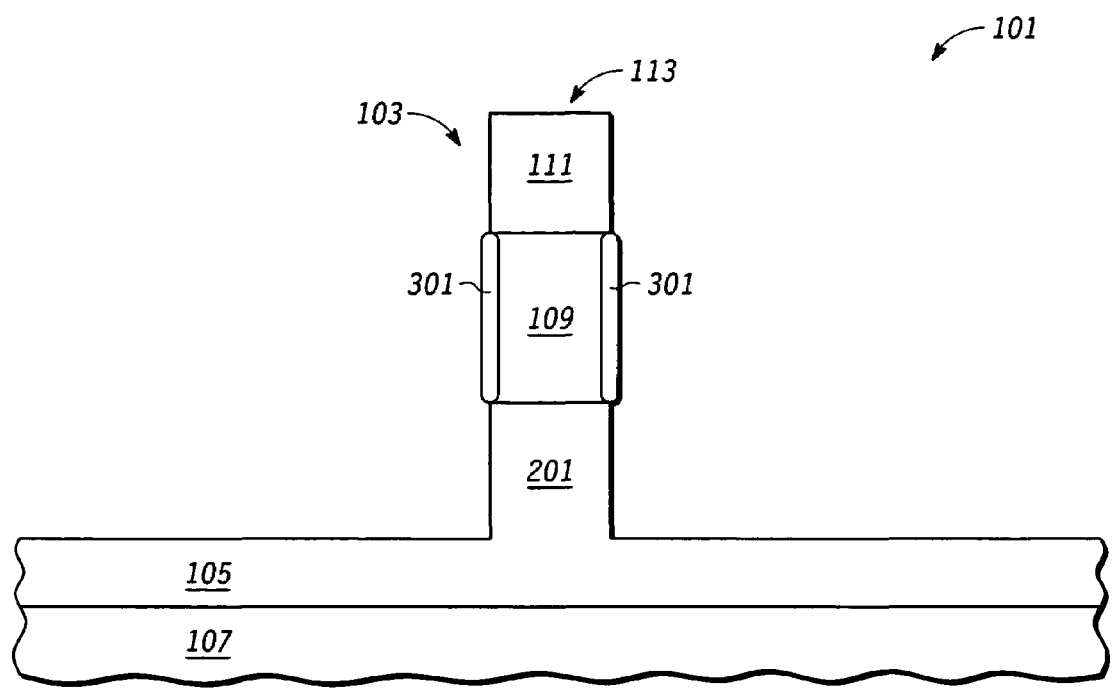
FIG. 3 is a partial cross-sectional view of one embodiment a wafer during another stage in its manufacture according to the present invention.

FIG. 3 shows a partial cross-sectional side view of wafer 101 after a tunnel dielectric 301 has been formed on the exposed sidewalls of semiconductor structure 109. In the embodiment shown, dielectric 301 is formed by oxidizing (e.g. with a process at temperatures in the range of 700–1000° C. in some embodiments) the exposed sidewalls of silicon structure 109. In other embodiments, a layer of dielectric material (e.g. $SiO_2$, $HfO_2$, HfSiON, SiN or combinations thereof) may be deposited over wafer 101 including on the side walls of structure 109. In some embodiments, structure 111 is removed prior to forming dielectric 301, wherein dielectric 301 is then formed on all exposed surfaces of 109 including on top of structure 109.

Figure 4:
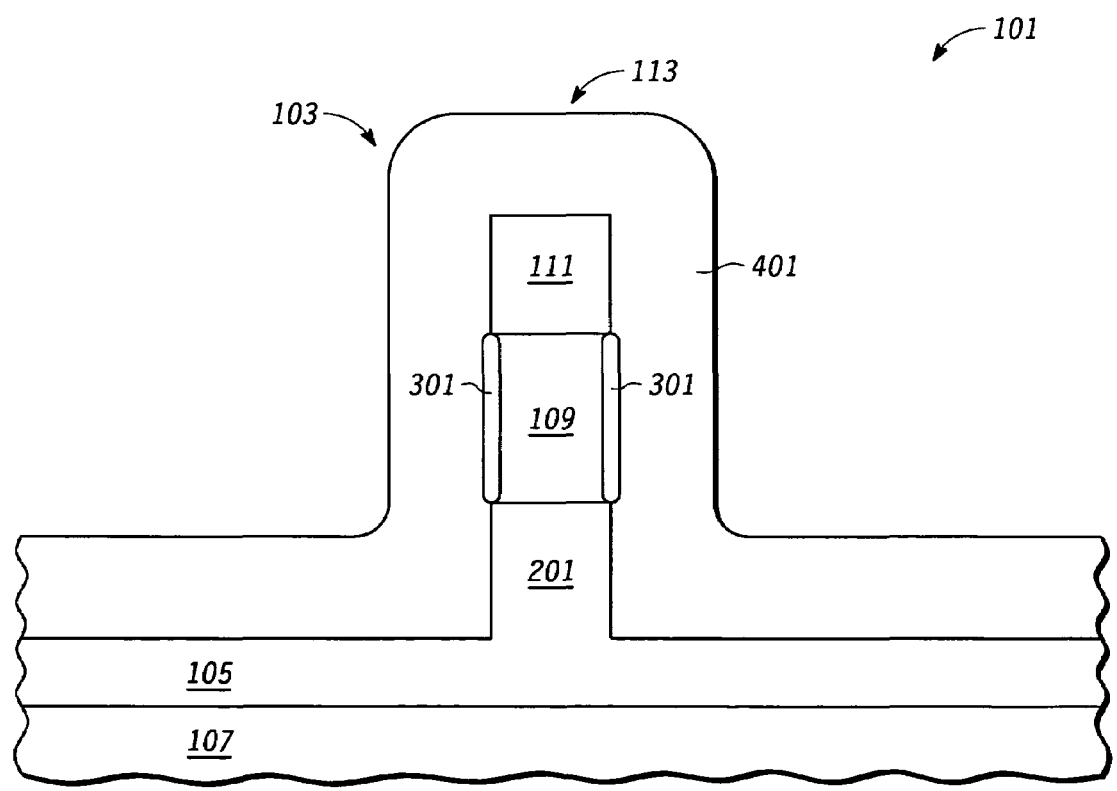
FIG. 4 is a partial cross-sectional view of one embodiment a wafer during another stage in its manufacture according to the present invention.

In FIG. 4, a layer of gate material is deposited over wafer 101. In one embodiment, layer 401 is a layer of polysilicon from which floating gate structures will be formed. In one embodiment, layer 401 is deposited by a chemical vapor deposition process but may be deposited by other processes in other embodiments. In other embodiments, layer 401 may be made of other types of material such as e.g. silicon nitride, hafnium, or titanium from which charge storing structures of transistor 103 will be formed. In some embodiments where layer 401 includes hafnium or titanium, the tunnel dielectric is formed by an oxidation process after the deposition of layer 401.

In some embodiments, subsequent to the stage shown in FIG. 4, layer 401 is etched (e.g. anisotropically) to form spacer structures (e.g. 501 in FIG. 5) adjacent to the sidewalls of vertical structure 113. In some embodiments, layer 401 is then patterned to form the floating gate structures prior to a subsequent formation of a control dielectric. In other embodiments, 401 would not be patterned prior to a subsequent formation of a control dielectric.

Figure 5:
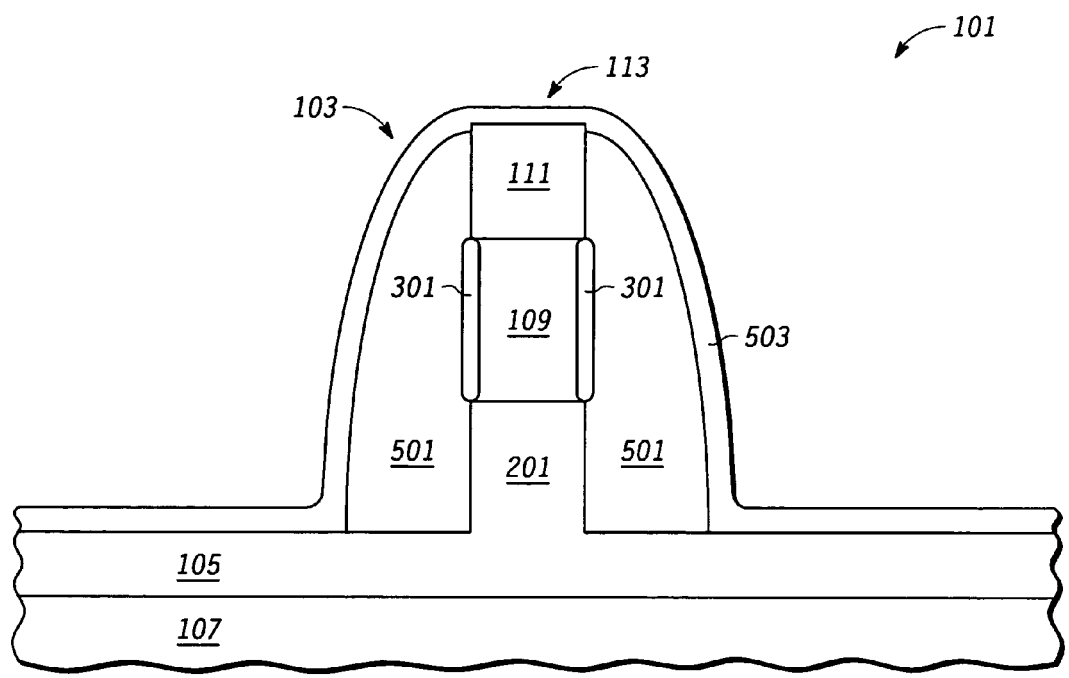
FIG. 5 is a partial cross-sectional view of one embodiment a wafer during another stage in its manufacture according to the present invention.

In FIG. 5, a layer 503 of dielectric is formed over wafer 101. Layer 503 will be utilized as the control dielectric of transistor 103. Layer 503 may include e.g. silicon oxide, a oxide-nitride-oxide stack, or other high K dielectrics such as hafnium oxide, titanium oxide, or an oxynitride. With some embodiments where layer 401 includes hafnium or titanium, layer 503 (and the tunnel dielectric) are formed from the oxidation of the hafnium layer.

Figure 6:
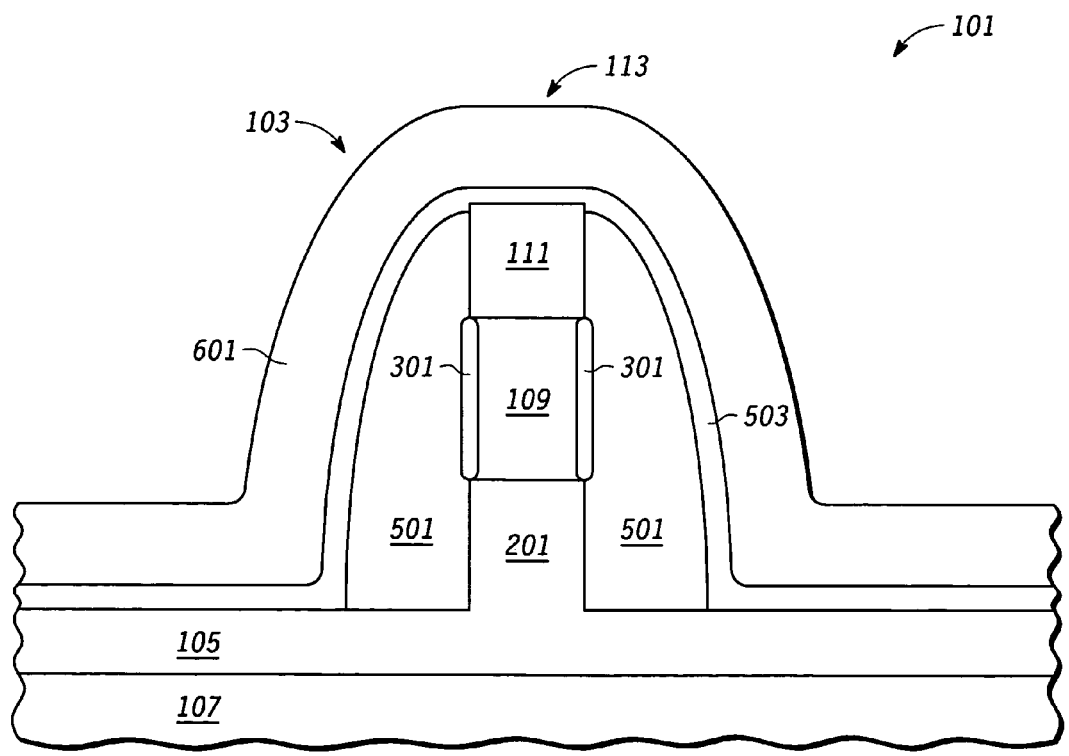
FIG. 6 is a partial cross-sectional view of one embodiment a wafer during another stage in its manufacture according to the present invention.

In FIG. 6, a layer 601 of gate material is formed over layer 503. In one embodiment, layer 601 includes polysilicon deposited by a chemical vapor deposition process, but may include other materials and/or may be deposited by other processes in other embodiments. In some embodiments, layer 601 is doped when deposited.

Figure 7:
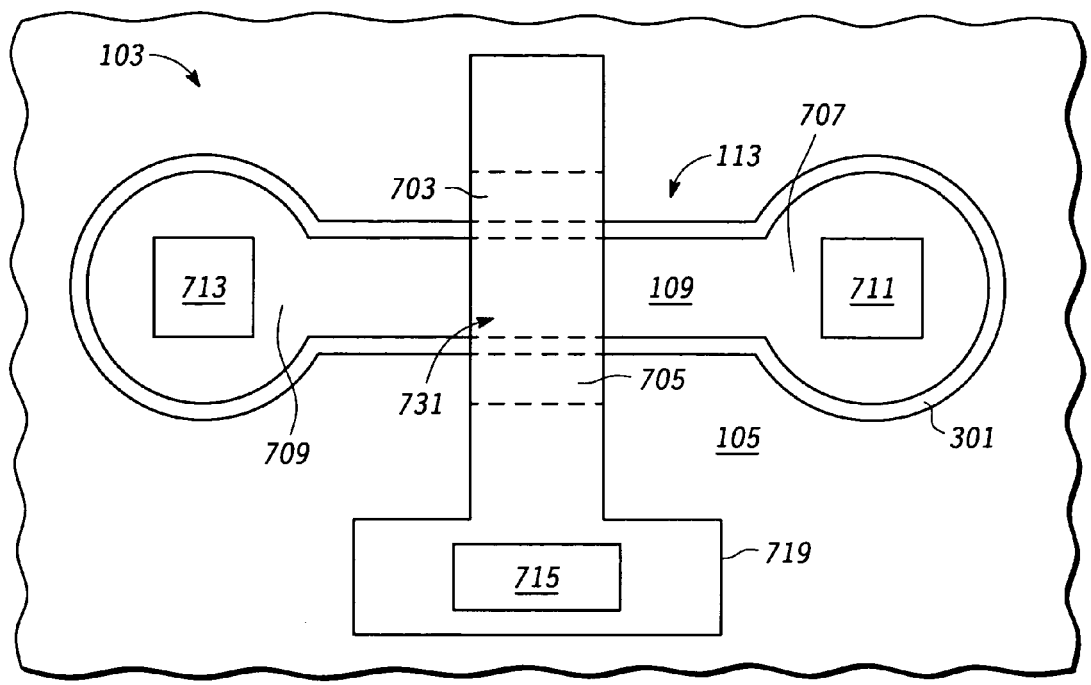
FIG. 7 is a partial top view of one embodiment a wafer during another stage in its manufacture according to the present invention.

FIG. 7 shows a top view of transistor 103 after layer 601 has been patterned to form a control gate structure 719. During the patterning, the portion of dielectric structure 111 located over vertical structure 113 outside of gate structure 719 is also removed. In other embodiments, the portion of dielectric structure 111 would remain over all of vertical structure 113. In some embodiments, source/drain regions 709 and 707 are doped (e.g. with boron, phosphorous, or arsenic) and then annealed after the patterning. Source/drain contacts 713 and 711 are located on semiconductor structure 109 in source/drain regions 709 and 707, respectively. In one embodiment, source/drain contacts 713 and 711 (as well as gate contact 715) are formed on silicided areas of these regions. The channel region 731 is located beneath gate structure 719 between source/drain region 709 and source/drain region 707.

During the patterning of control gate structure 719, structure 501 is patterned using structure 719 as a mask to form floating gate structures 703 and 705 in the embodiment shown. Also during the patterning, the portion of layer 503 not located under gate structure 719 is also removed. In one embodiment, a photoresist pattern and ARC (neither shown) having the shape of gate structure 719 is formed over layer 601. Layer 601 is then etched (e.g. with a dry etch followed by wet cleaning etch) with an etchant selective to poly silicon as per the pattern to form gate structure 719. In some embodiments, the etch chemistry is then changed to be selective to dielectric layer 503, to be selective to structure 501, and then to be selective to structure 111.

In other embodiments, structure 501 may be patterned prior to forming control gate structure 719. In some of these embodiments, the width of floating gate structures 703 and 705 have a smaller width than the control gate structure. Also with some of these embodiments, the control gate structure would include material on three sides of the floating gate structures. In other embodiments, the resultant floating gate structure of transistor 103 would extend over vertical structure 113 where structures 705 and 703 would be integrally connected.

Figure 8:
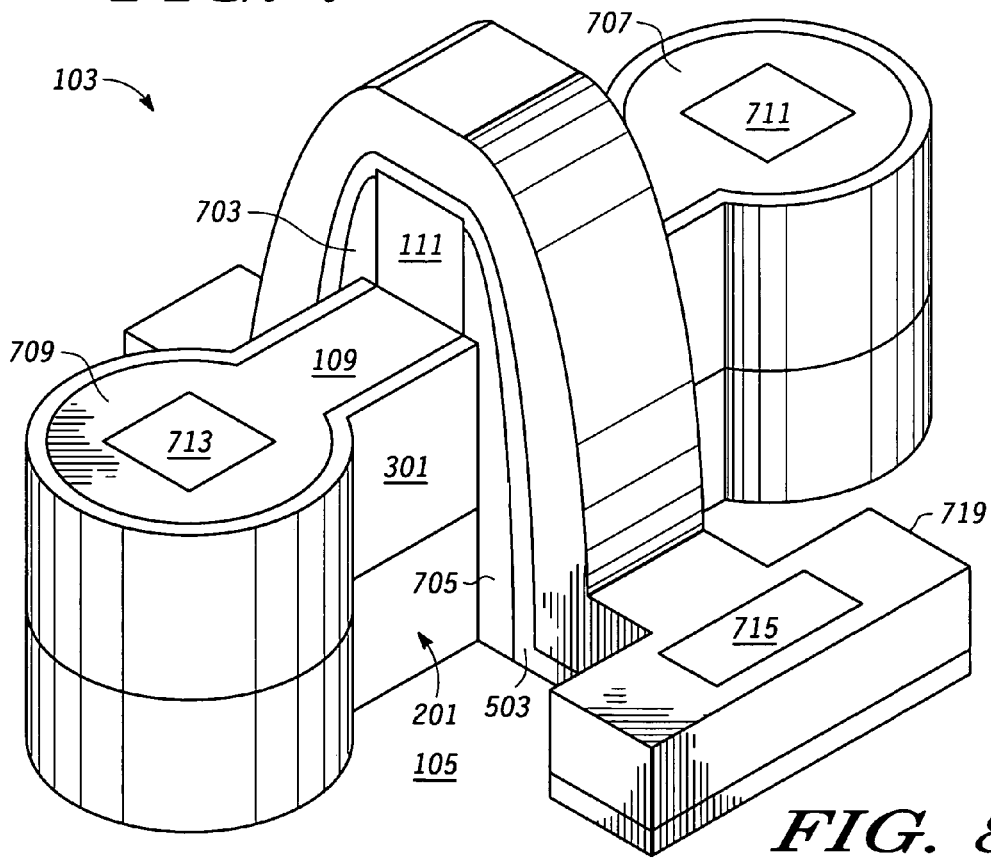
FIG. 8 is a partial perspective view of one embodiment a wafer during another stage in its manufacture according to the present invention.

FIG. 8 shows a perspective view of transistor 103 as shown in FIG. 7. Transistor 103 may include other structures not shown in FIGS. 7 and 8 such as e.g. spacers located between the gate structures and the source/drain regions. In other embodiments, vertical structure 113 may have other configurations. In some embodiments, vertical structure 113 may be part of an elongated structure that includes multiple channel regions and source/drain regions for multiple transistors.

During the manufacture of transistor 103, other transistors (not shown) similar to transistor 103 are formed on wafer 101 as well. In some embodiments, transistor 103 is a P-channel transistor with source/drain regions 707 and 709 doped with e.g. boron or material that forms positive ions. In other embodiments, transistor 103 is an N-channel transistor with source/drain regions doped with e.g. arsenic or phosphorous.

In processes subsequent to the views shown in FIGS. 7 and 8, other structures are formed on wafer 101 including e.g. interlevel dielectric layers, conductive interconnects and external electrical connectors. Afterwards, wafer 101 is singulated to form individual integrated circuits, each including multiple transistors similar to transistor 103.

In one embodiment, transistor 103 is implemented in a non volatile memory as a memory cell to store at least one bit by selectively inducing a charge in floating gate structures 705 and 703. In some embodiments, transistor 103 may be configured to store two bits. In one embodiment, transistor 103 is implemented in flash memory. In one embodiment, transistor 103 is implemented in a NOR flash memory. In another embodiment, transistor 103 is implemented in a NAND flash memory.

One advantage that may occur in some embodiments with the use of a dielectric structure (e.g. 201) in a vertical structure (e.g. 113) is that it may increase the opposing surface area between the control gate structure (e.g. 719) and the floating gate structures (e.g. 705 and 703) without increasing the area between the floating gate structures and the channel region (e.g. 731). This increase in surface area between the control gate structure and the floating gate structures, in some embodiments, increases the capacitance between the control gate and floating gate, without significantly increasing the capacitance between the floating gate an the channel region. Referring back to FIG. 8, for the embodiment shown, because the lower portion of floating gate structures 705 and 703 and the lower portion of gate structure 719 are laterally adjacent to structure 201, these lower portions act to increase the capacitance between the floating gate and the control gate of transistor 103 without increasing the capacitance between the floating gate and the channel region, in that the lower portions of structures 705 and 703 laterally adjacent to structure 201 do not significantly add to the capacitance between the floating gate and the channel region.

In some embodiments, the increase in capacitance between the control gate and the floating gate may result in a greater fraction of the program/erase bias voltage applied to the control gate being dropped between the floating gate and channel region. Equation 1 sets forth the voltage ($V_{FG}$) of a floating gate for a conventional floating gate transistor:

$$V_{FG} = \alpha_{FC} V_{CG} + \alpha_S V_S + \alpha_D V_D + \alpha_B V_B + Q/C_T \quad \text{(Eq. 1)}$$

wherein $\alpha_{FC} = C_{FC}/C_T$; and $$C_T = C_{FC} + C_S + C_D + C_B.$$

In the above equations, $V_{CG}$ is the control gate voltage, $V_S$ is $V_D$ is the drain voltage, $V_B$ is the well bias voltage, $\alpha_{FC}$ is the capacitance coupling ratio between the floating gate and the control gate, as is the capacitance coupling ratio between the floating gate and the source, $\alpha_D$ is the capacitance coupling ratio between the floating gate and the drain, $\alpha_B$ is the capacitance coupling ratio between the floating gate and the channel region; Q is the total charge on the floating gate; $C_{FC}$ is the capacitance between the floating gate and control gate; $C_S$ is the capacitance between the floating gate and source; $C_D$ is the capacitance between the floating gate and drain; $C_B$ is the capacitance between the floating gate and the channel region; and $C_T$ is the total capacitance.

As $\alpha_{FC}$ increases, $V_{FG}$ more closely follows the voltage applied at the control gate due to increased capacitance coupling. This may result in some embodiments, in a greater fraction of Fowler Nordheim program or erase bias voltage to be dropped between the floating and the channel region. This may, in some embodiments, improve the charge exchange between the channel region and the floating gate which may, in some embodiments, provide for smaller program/erase voltages, small erase program times, as well as a bigger memory window defined as the difference between the threshold voltages of the programmed and erased states.

In some embodiments, $\alpha_{FC}$ is greater than 0.7 where the height of structure 109 is 90 nm and structures 111 and 201 are each 75 nm in height.

Also, in some embodiments, implementing transistor with a dielectric structure (e.g. 201) in the vertical structure may minimize floating gate to floating gate coupling between adjacent bits and hence provides for increased density. Floating gate to floating gate coupling can limit density of NAND memories.

In some embodiments, transistor 103 may include two independent control gate structures. In one example, the control gate structures may be made by processes set forth in U.S. patent application, Ser. No. 10/443,375, entitled "Transistor With Independent Gate Structures," and having a filing date of May 22, 2003, all of which is incorporated by reference in its entirety.

In other embodiments, a transistor similar to transistor 103 may be made on a bulk semiconductor wafer wherein the under lying semiconductor material is oxidized or etched out and backfilled with dielectric to leave islands of semiconductor material.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming a transistor, comprising;
   forming a dielectric structure of a vertical structure and forming a semiconductor structure of the vertical structure, the semiconductor structure overlying the dielectric structure, wherein the dielectric structure has a height in a range of 80 to 200 nanometers;
   forming a gate structure of the transistor, the gate structure comprising a first portion that is laterally adjacent to the semiconductor structure and a second portion that is laterally adjacent to the dielectric structure;
   wherein a channel region of the transistor is located in the semiconductor structure.

2. The method of claim 1 further comprising:
   forming a source/drain region of the transistor within the semiconductor structure.

3. The method of claim 1 wherein the forming the dielectric structure further includes etching a dielectric using the semiconductor structure as a mask.

4. The method of claim 3 wherein the dielectric is a dielectric layer overlying a substrate.

5. The method of claim 1 wherein the forming of the dielectric structure and the forming the semiconductor structure further comprises:
   patterning a semiconductor layer overlying a dielectric, wherein after the patterning, the dielectric includes exposed portions; and
   removing exposed portions of the dielectric to form the dielectric structure.

6. The method of claim 5 wherein the removing exposed portions of the dielectric to form the dielectric structure further comprises:
   reducing the thickness of the dielectric at locations of the exposed portions.

7. The method of claim 1 further comprising:
   forming a dielectric layer prior to forming a gate structure, the dielectric layer is located at least on exposed sidewalls of the semiconductor structure.

8. The method of claim 1 wherein the gate structure is a floating gate structure of the transistor, the method further comprising:
   forming a control gate structure of the transistor, the control gate structure including a first portion laterally adjacent to the first portion of the gate structure, the control gate structure including a second portion that is laterally adjacent to the second portion of the gate structure.

9. The method of claim 8 wherein the control gate structure includes a portion overlying the vertical structure.

10. The method of claim 8 wherein the first portion of the gate structure and the first portion of the control gate structure are capacitively coupled during an operation of the transistor.

11. The method of claim 1 wherein the gate structure is a floating gate structure of the transistor, the method further comprising:
    forming a control gate structure of the transistor, the control gate structure including a first portion that is laterally adjacent to the semiconductor structure and a second portion that is laterally adjacent to the dielectric structure.

12. The method of claim 1 wherein the height of the dielectric structure is equal to or greater than the height of the semiconductor structure.

13. The method of claim 12 wherein the height of the dielectric structure is less than ten times the height of the semiconductor structure.

14. The method of claim 1 further comprising:
forming a second dielectric structure of the vertical structure, the dielectric structure overlying the semiconductor structure.

15. The method of claim 1 wherein the gate structure includes a portion overlying the semiconductor structure.

16. The method of claim 1 further comprising:
forming a second gate structure of the transistor, the second gate structure comprising
a first portion that is laterally adjacent to the semiconductor structure and a second portion that is laterally adjacent to the dielectric structure on an opposite side of the vertical structure from the first portion and the second portion of the gate structure.

17. A method for forming a transistor, the method comprising:
patterning a layer of semiconductor material located over a dielectric to form a semiconductor structure;
removing portions of the dielectric to form a dielectric structure, the semiconductor structure overlying the dielectric structure, wherein the dielectric structure has a height in a range of 80 to 200 nanometers;
forming a layer of gate material including over the semiconductor structure and dielectric structure;
forming a gate structure from the layer of gate material, wherein the gate structure comprises a first portion that is laterally adjacent to the semiconductor structure and a second portion that is laterally adjacent to the dielectric structure.

18. The method of claim 17 wherein the forming a gate structure further comprises:
forming a spacer structure from the layer of gate material;
patterning the spacer structure.

19. The method of claim 18 wherein the gate structure is a floating gate structure, the method further comprising:
forming a control gate structure, wherein the patterning the spacer structure includes using the control gate structure as a mask.

20. The method of claim 17 further comprising:
forming a source/drain region of the transistor within the semiconductor structure.

21. The method of claim 17 wherein the gate structure is a floating gate structure, the method further comprising:
forming a second layer of gate material including over the semiconductor structure and the dielectric structure;
forming a control gate structure from the second layer of gate material.

22. The method of claim 21 wherein the control gate structure includes a first portion laterally adjacent to the first portion of the gate structure and a second portion that is laterally adjacent to the second portion of the gate structure.

23. The method of claim 17 further comprising:
forming a dielectric layer prior to the forming a layer of gate material, wherein the forming the dielectric layer includes forming the dielectric layer on an exposed sidewall surfaces of the semiconductor structure.

24. The method of claim 17 wherein removing portions of the dielectric includes using the semiconductor structure as a mask.

25. The method of claim 17 wherein removing portions of the dielectric includes reducing the thickness of the dielectric at selected locations.

26. The method of claim 17 wherein removing portions of the dielectric includes etching the dielectric using the semiconductor structure as a mask.

27. The method of claim 17 wherein the semiconductor structure includes a channel region of the transistor.

28. The method of claim 17 further comprising:
forming a layer of dielectric material over the layer of semiconductor material;
patterning the layer of dielectric material to form a second dielectric structure, the second dielectric structure overlies the semiconductor structure.

29. A method for forming a transistor, comprising:
forming a dielectric structure of a vertical structure and forming a semiconductor structure of the vertical structure, the semiconductor structure overlying the dielectric structure, wherein the dielectric structure has a height in a range of 80 to 200 nanometers;
forming a floating gate structure of the transistor adjacent to the vertical structure, the floating gate structure comprising a first portion that is laterally adjacent to the semiconductor structure and a second portion that is laterally adjacent to the dielectric structure;
forming a control gate structure of the transistor, the control gate structure including a first portion that is laterally adjacent to the first portion of the floating gate structure, the control gate structure includes a second portion that is laterally adjacent to the second portion of the floating gate structure;
wherein a channel region of the transistor is located in the semiconductor structure.

30. The method of claim 29 further comprising:
forming a second floating gate structure of the transistor adjacent to the vertical structure, the second floating gate structure comprising a first portion that is laterally adjacent to the semiconductor structure and a second portion that is laterally adjacent to the dielectric structure;
wherein the floating gate structure is located adjacent to a first side of the vertical structure and the second floating gate structure is located adjacent to a second side of the vertical structure, the first side being an opposite side to the second side.

31. The method of claim 30 wherein the floating gate structure and the second floating gate structure are integrally coupled via a portion overlying the semiconductor structure.

32. The method of claim 29 further comprising:
forming a source/drain region of the transistor within the semiconductor structure.

33. The method of claim 29 wherein the control gate structure includes a portion overlying the semiconductor structure.

* * * * *